US010298229B2

(12) United States Patent
LaFountain et al.

(10) Patent No.: US 10,298,229 B2
(45) Date of Patent: May 21, 2019

(54) SWITCH ADAPTER

(71) Applicant: General Equipment and Manufacturing Company, Inc., Louisville, KY (US)

(72) Inventors: Robert L. LaFountain, Scottsburgh, IN (US); Gregory C. Merrifield, Prospect, KY (US); Michael Simmons, Louisville, KY (US)

(73) Assignee: General Equipment and Manufacturing Company, Inc., Louisville, KY (US)

( * ) Notice: Subject to any disclaimer, the term of this patent is extended or adjusted under 35 U.S.C. 154(b) by 123 days.

(21) Appl. No.: 15/399,736

(22) Filed: Jan. 5, 2017

(65) Prior Publication Data

US 2018/0191345 A1 Jul. 5, 2018

(51) Int. Cl.
*H01H 3/16* (2006.01)
*H01H 9/02* (2006.01)
(Continued)

(52) U.S. Cl.
CPC ....... *H03K 17/9505* (2013.01); *G01D 11/245* (2013.01); *G01D 11/30* (2013.01);
(Continued)

(58) Field of Classification Search
CPC ...... H01H 9/02; H01H 9/0264; H01H 9/0271; H01H 9/04; H01H 2009/048; H01H 9/041; G01R 33/0047; H03K 17/945; H03K 17/9455; H03K 17/9505; G01D 11/30; G01D 11/245; G01B 5/0002; G01B 5/0004
See application file for complete search history.

(56) References Cited

U.S. PATENT DOCUMENTS 5,121,110 A * 6/1992 Mahar, Jr. .............. G01B 7/023
248/27.1
6,617,845 B1 * 9/2003 Shafiyan-Rad ...... G01D 11/245
219/124.4

FOREIGN PATENT DOCUMENTS

EP         0443885 A1    8/1991
FR         2749384 A1   12/1997
JP      2004144655 A *   5/2004

OTHER PUBLICATIONS

Omron, "Proximity Sensor Accessories: Y92E", Dec. 2005, pp. 1-22.*

(Continued)

*Primary Examiner* — Ryan Johnson
(74) *Attorney, Agent, or Firm* — Marshall, Gerstein & Borun LLP

(57) ABSTRACT

A switch adapter can include a base having one or more openings, a support coupled to the base, and one or more retainers for coupling a switch to the adapter. The support can have one or more openings between its interior and exterior. The retainer can be adapted to couple to at least one of the base, the support, and a combination thereof. The switch adapter can include one or more switches, such as a replacement switch, and can be adapted for replacing a limit switch with a proximity switch. A proximity switch can be coupled to a switch adapter in one or more positions, and a switch adapter can be adapted to couple with a plurality of different switch mounts. A switch adapter can include a mass compensator for adjusting its center of gravity.

20 Claims, 5 Drawing Sheets

(51) Int. Cl.
*H01H 9/04* (2006.01)
*G01D 11/24* (2006.01)
*G01D 11/30* (2006.01)
*G01R 33/00* (2006.01)
*H01H 36/00* (2006.01)
*H03K 17/95* (2006.01)
*H03K 17/945* (2006.01)

(52) U.S. Cl.
CPC ........... *G01R 33/0047* (2013.01); *H01H 3/16* (2013.01); *H01H 9/0207* (2013.01); *H01H 9/04* (2013.01); *H01H 36/0033* (2013.01); *H01H 36/0046* (2013.01); *H03K 2017/9455* (2013.01)

(56) References Cited

OTHER PUBLICATIONS

International Search Report and Written Opinion for PCT/US2017/068504, dated Apr. 3, 2018.

\* cited by examiner

SWITCH ADAPTER

CROSS REFERENCE TO RELATED APPLICATIONS

Not applicable.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

Field of the Invention

The inventions disclosed and taught herein relate generally to limit switches; and more specifically relate to adapters for proximity switches.

Description of the Related Art

Limit switches can be used in many operational environments to provide a changing electrical signal, such as by opening or closing a circuit, depending on the proximity of an object or target to the switch. Limit switches can be used for numerous different applications, which can include determining the presence, absence, passing, positioning, or end of travel of an object. In one common application, for example, a proximity switch, such as a magnetic proximity switch, can be used in conjunction with a valve to sense when the valve is in an open or closed position. Other types of limit switches include mechanical, lever arm type switches with an actuator linked to a set of electrical contacts; when the actuator comes in contact with an object, it can make or break an electrical connection.

A magnetic proximity switch can include a common electrical contact that is movable between two different contacts to complete either a first circuit or a second circuit. The common contact may include or be attached to a ferrous or magnetic sensing member that shifts in a first direction when a target, such as another magnet or ferrous structure, approaches within a certain distance, or sensing range, of the sensing member. The sensing member and/or the common contact may be biased to shift in a second direction when the target is disposed away from the sensing member beyond the sensing range. In this manner, the switch may make or break a circuit without physical contact between the sensing member and the target, whereas a lever arm switch may accomplish a similar result when the lever arm and an object move in and out of contact with one another.

Proximity switches can be used in relatively harsh operating environments, such as under water or in environments in which abrasives, such as dirt, metal shavings, and/or caustic chemicals, are present. Such environments can include sites for oil and gas extraction, chemical and petrochemical refineries, industrial plants such as steel mills, manufacturing and machining operations, and offshore or desert environments, among others. Proximity switches are also used in environments where fail-safe operation is of a top priority, such as nuclear power generation plants, and in environments in which equipment used must meet particular operating specifications, e.g., in order to prevent malfunctioning under extreme or other operating conditions. In nuclear applications, for example, some such specifications are intended to prevent malfunctioning of components under elevated seismic acceleration loading. In such applications, the center of gravity of a switch may be a relevant consideration in determining whether the switch is suitable for the application.

In some applications, it may be more desirable to use one type of limit switch instead of (or in some cases, collectively with) another type of limit switch. For instance, a magnetic proximity switch may be more desirable than a lever arm type switch in an application where it is desired or necessary to avoid contact between the switch and the target. In other instances, one may wish to replace one switch with another switch, such as when a switch has malfunctioned or surpassed its operating life. In these and other cases, a new switch may differ from an old switch, such as when switching from a contact switch to a contactless switch, from one switch manufacturer to another switch manufacturer, or from one switch arrangement to another switch arrangement.

When changing from one switch to another, such as from a lever arm switch to a magnetic proximity switch, etc., a problem can arise in that the bracketry or other mounting structure for the new switch may not match that of the old switch. Similarly, the mechanical attributes of the switches may differ, such as the masses, centers of gravity, or the like. This can call for design changes to existing equipment or other portions of a system, such as designs for new brackets, new targets, different electrical connections, or for other aspects of an application relating to the fit, form, or function of a switch at hand. In some cases, the time and expense of such changes can be significant, or even prohibitive. Thus, a need exists in the art for improved manners of replacing limit switches, including for replacing lever arm type mechanical switches with proximity sensors.

The embodiments disclosed and taught herein are directed to improved systems and methods for replacing limit switches.

BRIEF SUMMARY OF THE INVENTION

In at least one embodiment, a switch adapter can include a base having one or more openings, such as thru or other openings, one or more supports coupled to the base, and one or more retainers. A support can have one or more accesses, such as one or more openings, which can include a first access and a second access, such as between an interior and an exterior of the support, or between two or more other portions of the support. A retainer can be adapted to couple to at least one of the base, the support, and a combination thereof. In at least one embodiment, the support can be adapted to couple to one or more switches, such as a proximity switch, which can include a switch adapted to take the place of another switch. An access of the support can be adapted to receive or otherwise support at least a portion of a proximity switch there through or therein, in whole or in part. A second or other access of the support can be adapted to receive or otherwise support at least one of a portion of the proximity switch, an electrical or other component coupled to the proximity switch there through or therein. One or more retainers or other couplers can be adapted to retain the proximity switch (if present) in at least one position relative to the support, base, or another portion of the switch adapter.

In at least one embodiment, a switch adapter can include a base having plurality of openings therein or there through, which can include two or more sets or groups of openings, such as a first set of openings adapted to couple the base to the support and a second set of openings adapted to couple the base to a switch mount, separately or in combination, in whole or in part. Two or more sets of openings of a switch adapter or portion thereof can be adapted to couple with one or more couplers, such as fasteners, and can be adapted to receive two or more couplers from one or more directions, which can include two or more different directions and, In at least one embodiment, opposite directions. A switch adapter can be adapted to hold or otherwise support one or more proximity switches in one or more positions, and can include one or more switches coupled to the adapter, such as to one or more components or portions thereof, separately or in combination, in whole or in part.

In at least one embodiment, a switch adapter can include one or more retainers adapted to couple to one or more portions of the adapter, such as a retainer(s) coupled to at least one of the base and the support, e.g., with one or more couplers. The switch adapter and a retainer can have one or more mounting patterns, such as a first or other mounting pattern. In at least one embodiment, a plurality of openings of the base can include openings having a second mounting pattern, such as a mounting pattern for coupling with a switch mount, bracket, or other structure. In at least one embodiment, two or more mounting patterns, such as a first mounting pattern and a second mounting pattern, or other mounting patterns, can be different in one or more manners, such as by having a different configuration of couplers.

In at least one embodiment, a switch adapter can be adapted to couple a switch to a switch mount, and can include a support adapted to couple to one or more switches, such as a magnetic proximity switch or other switch, and a base adapted to couple to one or more switch mounts, such as a mechanical limit switch mount or other switch mount. A switch adapter can be or include one or more at least partial enclosures, such as for at least partially enclosing a switch coupled with the adapter, one or more other components of the system, or one or more portions of any of them. In at least one embodiment, a switch adapter can include an enclosure adapted to enclose at least a portion of a proximity switch within an interior of the enclosure. A switch adapter can include one or more lids or other covers adapted to couple to the adapter, such as to the support or base. In at least one embodiment, a switch adapter can include a lid adapted to hold a retainer in one or more positions, such as in place relative to the support, which can include clamping or forcing at least a portion of the retainer between the lid and one or more other portions of the adapter. In at least one embodiment, a switch adapter can include a base adapted to couple to one or more switch mounts, such as a bracket or other structure for holding a switch. A switch adapter can be adapted to couple with a plurality of different switch mounts, such as two or more switch mounts having mounting configurations that differ from one another, such as by having different arrangements of couplers (e.g., male or female), openings, mating structures, or other mounting components.

In at least one embodiment, a switch adapter can include one or more electrical components, such as junctions, terminal blocks, electrical couplers, or other components for electrical communication, which can include one or more electrical components coupled at least partially within an interior of the adapter or a portion thereof, such as a support or base. In at least one embodiment, a switch adapter can be adapted to couple in a plurality of positions relative to one or more switch mounts, which can include having a base adapted to couple a support in a plurality of positions relative to a switch mount.

In at least one embodiment, a switch adapter can have an adjustable center of gravity, which can include having a mass compensator. In at least one embodiment, a mass compensator can include one or more weights or weighted structures adapted to couple to at least one portion of the adapter, such as to the base, the support, or a combination thereof. A switch adapter can include one or more weights adapted to be coupled to at least one of a base and a support in a plurality of positions, and a mass compensator can include one or more couplers for coupling one or more weights to one or more other components of the adapter. In at least one embodiment, a switch adapter can include a mass compensator adapted to change the center of gravity of the switch adapter from a first center of gravity to a second center of gravity, such as by moving the center of gravity of the adapter, which can include moving the center of gravity among one or more locations. In at least one embodiment, a switch adapter can include a mass compensator adapted to adjust the center of gravity of the switch adapter.

In at least one embodiment, a switch adapter system can include a proximity switch and a switch adapter. A switch adapter can include a base having a plurality of openings there through, a support coupled to the base, and one or more accesses from an interior to an exterior of the adapter. One or more retainers can be coupled to the adapter, such as to at least one of the base and the support. One or more proximity switches can be coupled to the support. At least a portion of a proximity switch can extend or otherwise be disposed at least partially within or through one or more accesses. At least one of a portion of a proximity switch and an electrical component or other switching component coupled to the proximity switch, directly or indirectly, can extend or otherwise be disposed at least partially in or through one or more accesses or other openings. A retainer can be adapted to retain a proximity switch in a plurality of positions relative to the support or another component of a switch adapter. A switch adapter can include one or more accesses in one or more sides, such as a first access disposed in one end of the adapter and one or more other accesses disposed in another end of the adapter, which can include opposite ends of the adapter or a component thereof. A switch adapter can include a plurality of openings or sets of openings, such as through the base, which can comprise a first set of openings and a second set of openings, or other groups of openings. Two or more openings or sets of openings can have different mounting patterns, which can be or include mounting patterns for different switches or switch mounts.

In at least one embodiment, a method of implementing a switch adapter according to the disclosure, such as for replacing a limit switch with a proximity switch, can include providing a switch adapter according to the disclosure. For example, a method can include providing a switch adapter comprising a base having a plurality of openings, a support coupled to the base, the support having a first access and a second access between an interior and an exterior of the support, and a retainer adapted to couple to at least one of the base and the support, wherein the retainer can be adapted to retain a proximity switch in at least one position relative to the support, and wherein the plurality of openings of the base can comprise at least two mounting patterns, such as mounting patterns matching a different limit switch mounting pattern or other pattern for a switch mount. A method can include removing a limit switch from a switch mount and coupling the switch adapter to the switch mount in place of the limit switch. A method can include coupling a proximity switch to a support with a retainer, which can include disposing a switch so that at least a portion of the switch extends at least partially through one or more accesses of a switch adapter. A method can include disposing a switch so that at least one of a portion of the switch and an electrical component or other component coupled to the switch extends at least partially through one or more accesses. A method can include adjusting the center of gravity of a switch adapter, which can include coupling at least one weight to the adapter or a component thereof, such as to the base, support, or another portion of a switch adapter, separately or in combination.

DETAILED DESCRIPTION OF THE INVENTION

Figure 1:
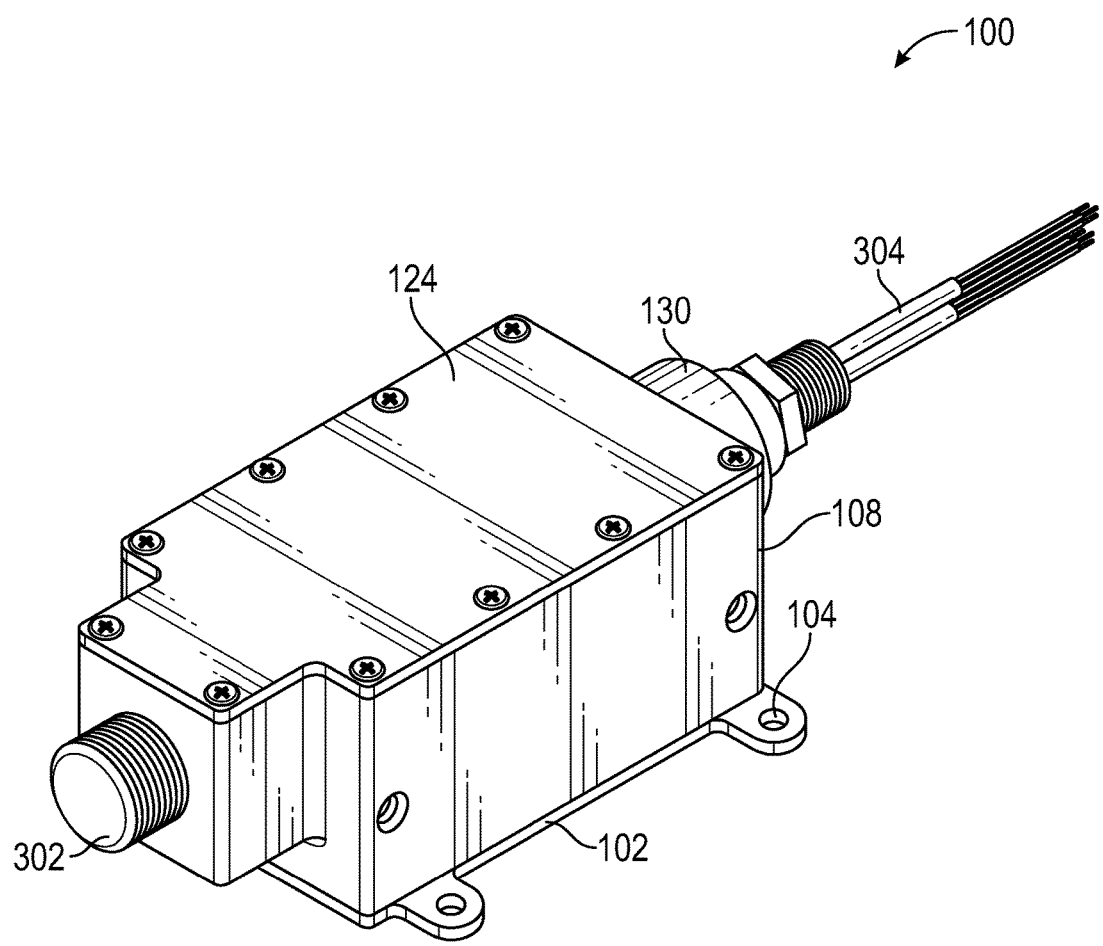
FIG. 1 is an isometric view of one of many embodiments of a switch adapter according to the disclosure.

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goals for a commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. The use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the figures and are not intended to limit the scope of the invention or the appended claims.

The terms "couple," "coupled," "coupling," "coupler," and like terms are used broadly herein and can include any method or device for securing, binding, bonding, fastening, attaching, joining, inserting therein, forming thereon or therein, communicating, or otherwise associating, for example, mechanically, magnetically, electrically, chemically, operably, directly or indirectly with intermediate elements, one or more pieces of members together and can further include without limitation integrally forming one functional member with another in a unity fashion. A coupling can occur in any direction, including rotationally. The terms "including" and "such as" are illustrative and not limitative. Unless otherwise indicated, the terms and terminology used herein encompass variations that would be understood by a person of ordinary skill in the art considering realities associated with a physical embodiment of the disclosure.

Applicants have created improved systems and methods for replacing a limit switch with another limit switch, such as for replacing a lever arm type switch with a magnetic proximity switch. One or more systems of the disclosure can be generally referred to as a switch adapter. A switch adapter can be a "universal" switch adapter adapted to replace any of a plurality of different switches with another switch, which can include replacing any of two or more switches having different mounting configurations with a switch having yet another mounting configuration. In at least one embodiment, a switch adapter can convert a switch mount from one mounting configuration, e.g., a mounting configuration for an existing lever arm switch, to another mounting configuration, e.g., a mounting configuration for a proximity switch substituted for the existing switch. In at least one embodiment, a switch adapter can be adapted for replacing a plurality of switches with a plurality of other switches. A switch adapter according to the disclosure can at least reduce the time and expense associated with limit switch replacement in some applications, such as when replacing a lever arm switch with a magnetic proximity switch, which heretofore can involve numerous design and implementation changes that, in some cases, can impede or even prevent replacement of an inferior switch with a superior switch. A switch adapter according to the disclosure can allow for replacement of one or more existing limit switches, such as in commercial or nuclear environments, without the need for replacing the existing switch mount, or bracket. In at least one embodiment, a switch adapter according to the disclosure can allow for replacement of one or more existing limit switches without the need for replacing one or more of existing targets, junction boxes, mounting brackets, or other switching structures, which can include avoidance of a need for engineering level design changes to a system in which a switch is used, such as a valve control, valve top box, position sensing system, or other system utilizing one or more proximity switches or other limit switches.

Figure 2:
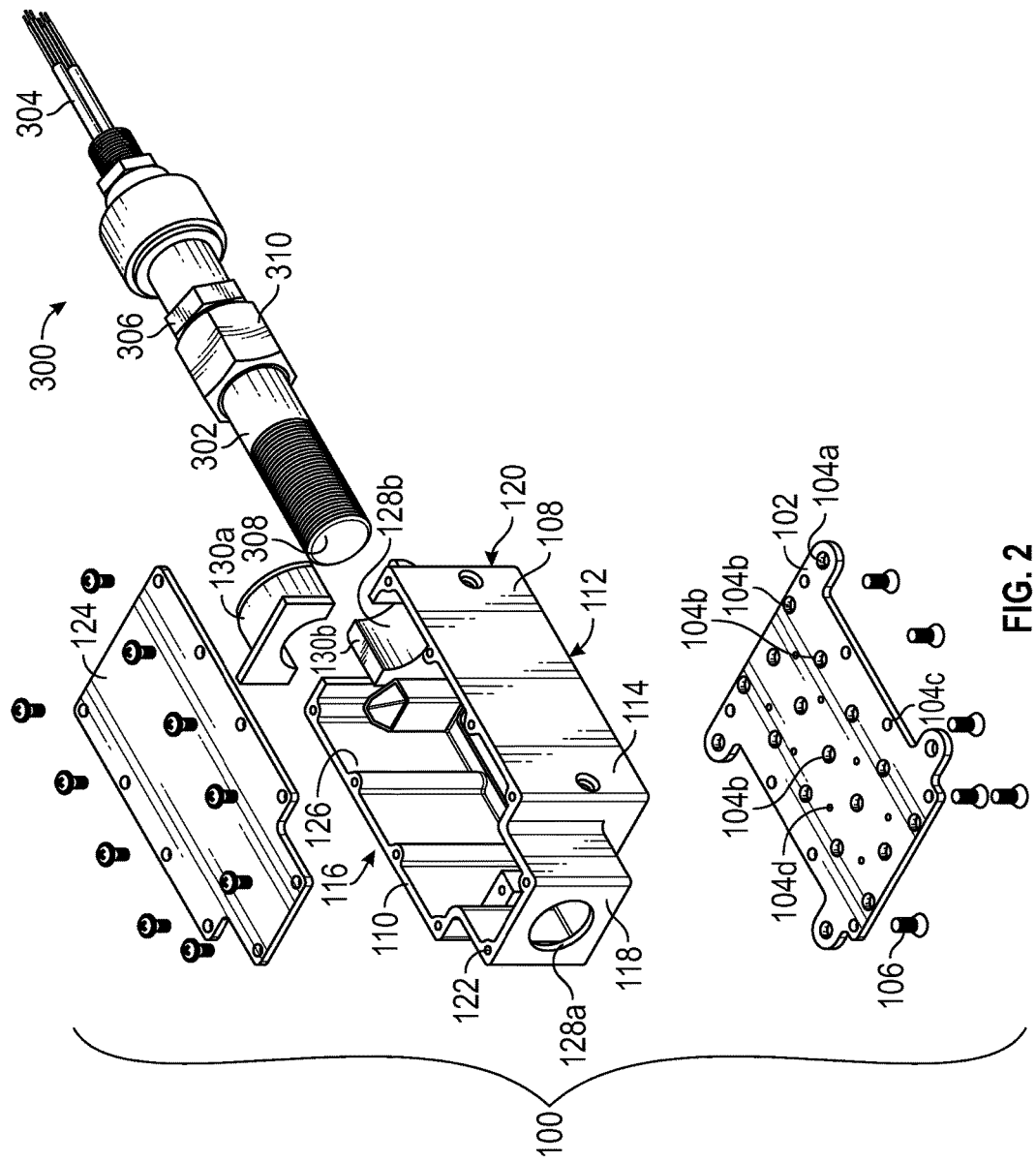
FIG. 2 is an exploded view of the switch adapter of FIG. 1.
Figure 3:
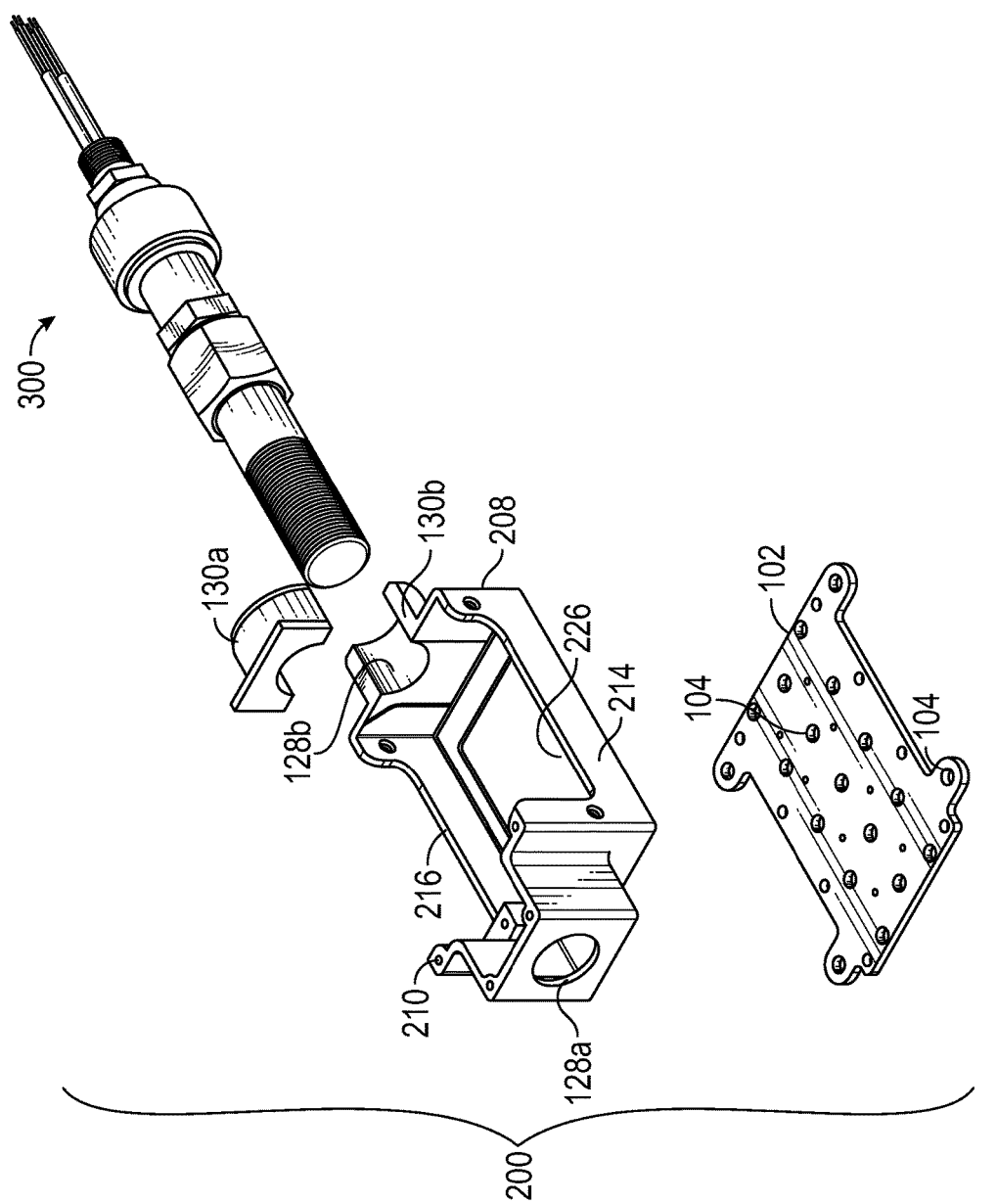
FIG. 3 is an exploded isometric view of another of many embodiments of a switch adapter according to the disclosure.
Figure 4:
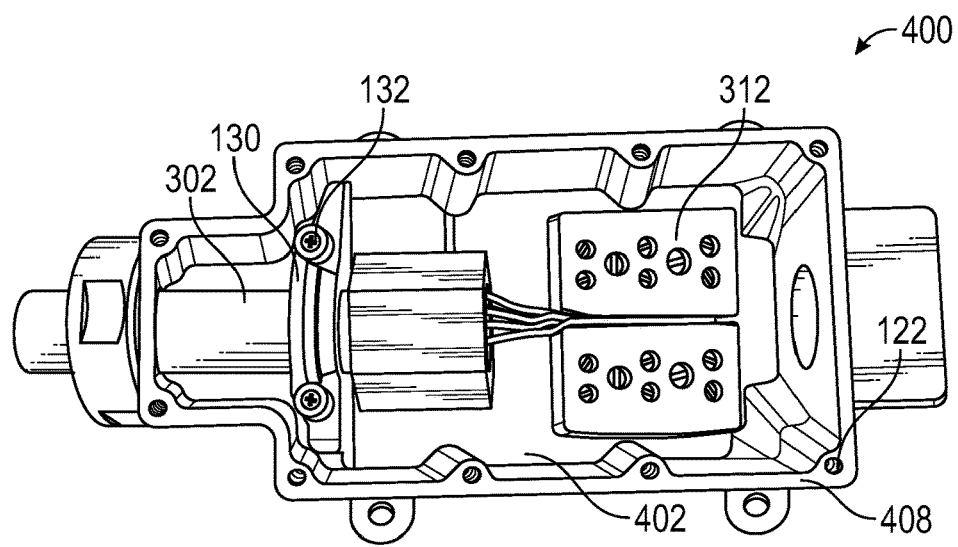
FIG. 4 is a top view of yet another of many embodiments of a switch adapter according to the disclosure.
Figure 5:
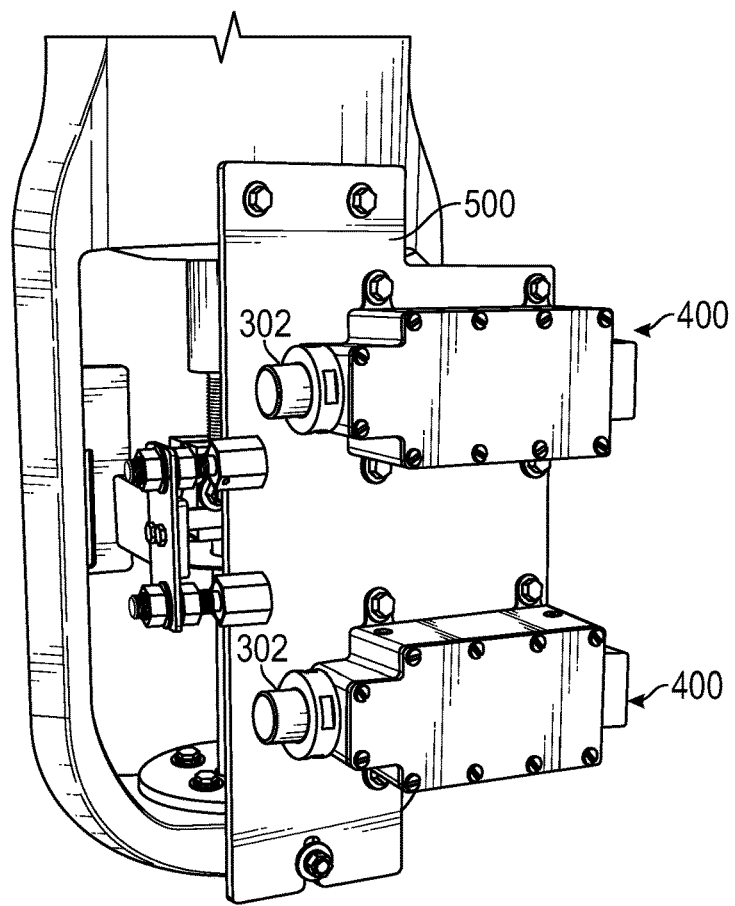
FIG. 5 is a perspective view of one of many embodiments of a switch mount comprising two switch adapters according to the disclosure.
Figure 6:
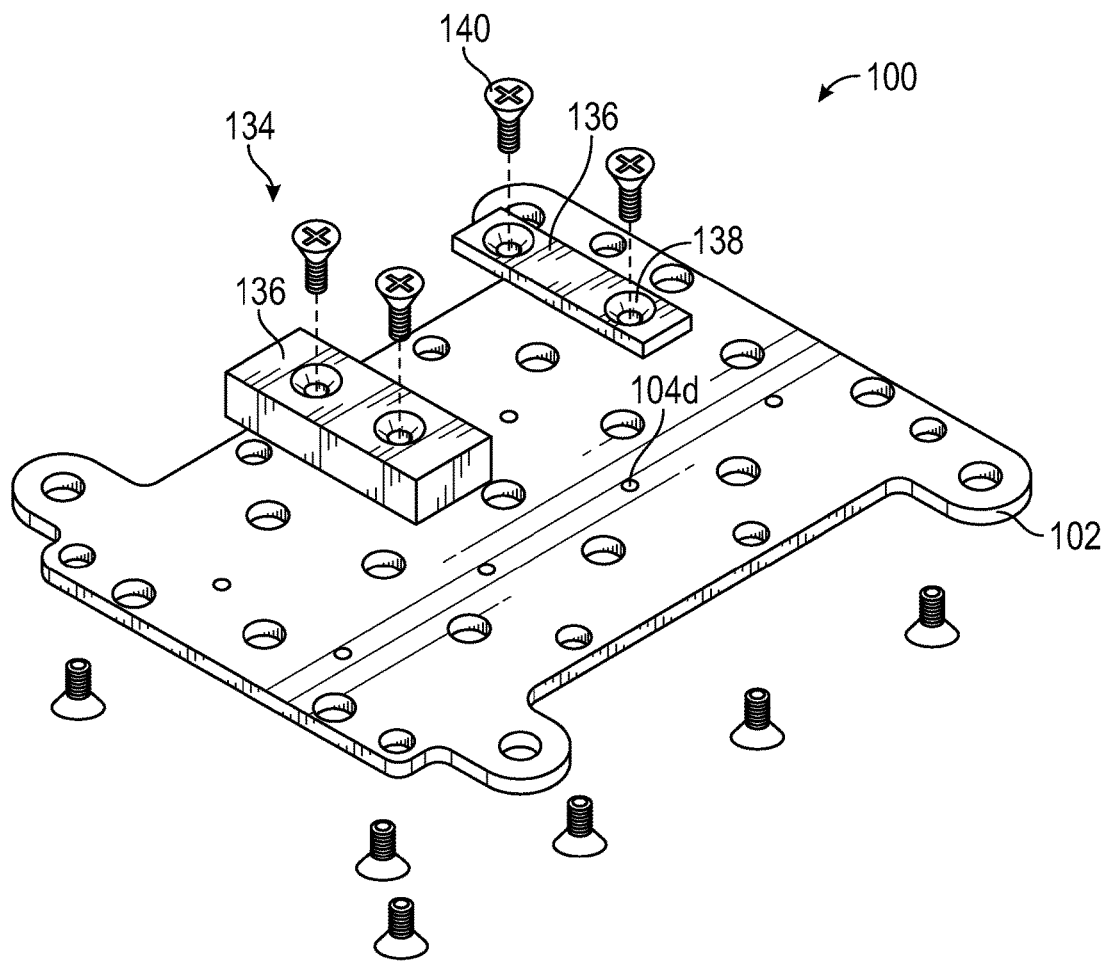
FIG. 6 is an isometric view of one of many embodiments of a switch adapter having a mass compensator according to the disclosure.

FIG. 1 is an isometric view of one of many embodiments of a switch adapter 100 according to the disclosure. FIG. 2 is an exploded view of the switch adapter 100 of FIG. 1. FIG. 3 is an exploded isometric view of another of many embodiments of a switch adapter 200 according to the disclosure. FIG. 4 is a top view of yet another of many embodiments of a switch adapter 400 according to the disclosure. FIG. 5 is a perspective view of one of many embodiments of a switch mount 500 comprising two switch adapters 400 according to the disclosure. FIG. 6 is an isometric view of one of many embodiments of a switch adapter 100 having a mass compensator system 134 according to the disclosure. FIGS. 1-6 will be described in conjunction with one another.

In at least one embodiment, a switch adapter 100 can include one or more bases 102, such as a plate, mount, foundation, or other supporting structure, for supporting one or more other components of adapter 100 and for coupling adapter 100 to one or more other structures, such as a switch mount or bracket (see, e.g., FIG. 5), which shall generally be referred to herein as a "mount" for purposes of simplicity and explanation. As will be understood by a person of ordinary skill in the art having the benefits of the present disclosure, depending on the application, a mount for a limit switch may have any of numerous different configurations for mounting a limit switch to a device or system for operation, and the term mount as used herein encompasses those configurations, whether now known or later developed. The mount 500 shown in FIG. 5 for illustrative purposes is a switch mount adapting from a lever arm limit switch to a contactless proximity switch, which is but one example of many. Base 102 can be or include an at least substantially flat plate, or may include a plate or other bottom portion having one or more structures coupled thereto or extending therefrom, such as supports, aligners, posts, or other structures for coupling with one or more components of adapter 100 or a system including adapter 100. Base 102 can include one or more openings 104, such as partial or thru holes, slots, or other voids, for coupling base 102 to a mount or for coupling one or more other components of adapter 100 to base 102, separately or in combination, in whole or in part. In at least one embodiment, base 102 can include two or more different openings 104 (see FIG. 2), which can include sets or groups of openings 104, such as a first set of openings 104a for coupling base 102 to a mount, a second set of openings 104b for coupling base 102 to one or more other mounts, a third set of openings 104c for coupling base 102 with one or more components of adapter 100, and a fourth set of openings 104d for coupling base 102 with one or more other components of adapter 100. Adapter 100 can include one or more couplers 106, such as screws, bolts, or other fasteners, for coupling base 102 to a mount or for coupling one or more other components of adapter 100 with base 102, separately or in combination, in whole or in part. Two or more openings 104 or sets of openings 104 can be the same or different (e.g., in size, shape, threads (if present), pattern, etc.), as needed or desired for a particular application or implementation of adapter 100. In at least one embodiment, two or more openings 104 or sets of openings 104 can be adapted to couple base 102 to a plurality of different switch mounts, separately or in combination with providing multi-axis adjustability of switch adapter 100 relative to a switch mount or of one or more other components of switch adapter 100 relative to base 102.

In at least one embodiment, switch adapter 100 can include one or more supports 108, such as an enclosure, bracket, or other structure for coupling with base 102 and supporting one or more other components of adapter 100. Support 108 can, but need not, be formed integrally with base 102, in whole or in part. Support 108 can include a top 110, bottom 112, and one or more sides, such as a first side 114, a second side 116, a front end 118 and a rear end 120. As shown in FIGS. 1 and 2 for illustrative purposes, support 108 can be generally rectangular and can have a cross-sectional shape that varies along a dimension in at least one direction, such as along its length, height, width, or a combination thereof, or for example, along one or more axes, such as an X, Y or Z axis, separately or in combination, in whole or in part. In at least one embodiment, support 108 can be or include a shape other than rectangular, such as circular, cylindrical, oblong, triangular, pentagonal, or another shape, which can be any shape desired for a particular application. For instance, support 108 be of a shape adapted to couple to a corresponding base 102 or other component of adapter 100 as well as to support a switch (further described below), which can differ among embodiments depending on one or more implementation-specific factors, such as the type of switch being supported, the type of switch mount at hand, or other considerations relating to implementation of a physical embodiment of a switch adapter according to the disclosure. Support 108 can include one or more couplers 122 (e.g., male or female couplers) for coupling with one or more other couplers (e.g., couplers 106), such as threaded openings adapted to receive screws, bolts, or other threaded fasteners. The use of other couplers or sets of couplers is possible, such as rivets, snap lock couplers, tension couplers, biasing devices, or other couplers adapted to couple two or more of the components described herein.

In at least one embodiment, such as that shown in FIGS. 1 and 2 for illustrative purposes, switch adapter 100 can include one or more lids 124, such as a cap, cover, or top, for covering at least a portion of support 108. In such an embodiment, which is but one of many, lid 124 can be coupled to support 108 and can at least partially enclose some or all of the interior 126 of support 108, such as in cooperation with one or more sides 114, 116, 118, 120 of support 108 and base 102. In other words, in at least one embodiment, switch adapter 100 can be or include an at least partial enclosure for enclosing or housing at least a portion of a switch assembly 300, which can include, for example, a switch 302, a conduit 304, such as a wire or set of wires, for communicating with one or more other components of a switching system in which adapter 100 is utilized, and a switch coupler 306 for coupling switch 302 with conduit 304. In such an embodiment, lid 124 can be sealingly coupled to support 108 and/or base 102, which can include the use of one or more seals (not shown) disposed between lid 124 and, e.g., support 108, such as gaskets, O-rings, adhesives, or the like. In at least one embodiment, switch adapter 100 can be or include an at least substantially water- or air-tight enclosure, such as a hermetically sealed enclosure, for protecting a switch 302 or other components housed therein from an environment surrounding adapter 100, which can, in at least one application, comprise substances potentially harmful to switch assembly 300 or to the operation of a component thereof, such as salt or fresh water, extreme high or low temperatures, dirt, chemicals, or other hazardous conditions. However, that need not be the case and, in at least one embodiment, switch adapter 100 need not be or include a sealed or at least substantially sealed enclosure.

More specifically, with continuing reference to the figures and particular reference to FIG. 3, a switch adapter 200 is shown. Switch adapter 200, which is but one embodiment of many, can include a support 208 that generally functions in the same manners described herein with reference to support 108 for illustrative purposes, but which need not include enclosed sides or a lid. In other words, in at least one embodiment, a switch adapter 200 can include a support 208 having one or more open features, such as an open top 210, or one or more open sides 214, 216, that allow fluid communication between an interior 226 of support 208 and a surrounding environment. An embodiment such as the exemplary embodiment of switch adapter 200 can be used, for example, in applications where a sealed housing or more complete enclosure is not needed, or, as another example, wherein more ready access to interior 226 or to a switch assembly 300 coupled with switch adapter 200 may be desired.

With continuing reference to FIGS. 1-3, support 108 can include one or more accesses 128a, 128b, etc., such as openings or holes, for cooperating with and supporting switch assembly 300 or one or more components thereof. For example, support 108 can have an access 128a for allowing at least a portion of a switch 302 to pass through a wall or other portion of support 108, which can include disposing a first end 308 of switch 302, such as a sensing end, outside of interior 126, e.g., for communication with a target (not shown). Access 128a can be of a size and shape sufficient to allow a portion of switch 302 to pass there through and, in at least one embodiment, can be configured to hold switch 302 or a portion thereof in one or more positions relative to support 108 or one or more other components of adapter 100. As another example, support 108 can have an access 128b for allowing one or more other portions of a switch assembly 300 to pass from interior 126 to the exterior of switch adapter 100, such as a second end 310 of switch 302, conduit 304, or switch coupler 306, separately or in combination, in whole or in part. Access 128b can be adapted to mate with or otherwise couple to second end 310 of switch 302 or switch coupler 306 for holding switch assembly 300 in place relative to switch adapter 100. In at least one embodiment, switch adapter 100 can include one or more clamps 130 for coupling switch assembly 300 to support 108, and at least a portion of access 128b (or access 128a) can be formed in or by the clamp 130 (if present). In such an embodiment, clamp 130 can be adapted to couple with a portion of switch 302, switch coupler 306, or a combination thereof, which can include clamping such component(s) in place against or relative to support 108. For example, clamp 130 can include a moveable portion 130a adapted to be coupled to a fixed portion 130b with one or more couplers 132 (see FIG. 4), such as threaded or other fasteners. As another example, moveable portion 130a can be adapted to be held in place by one or more other components of switch adapter 100, such as by being clamped between lid 124 and fixed portion 130b (see FIG. 1) about switch 302 or another portion of switch assembly 300, whether separately or in combination with the use of one or more couplers 132. While accesses 128a, 128b are shown to be in front and rear ends 118, 120 of support 108 for illustrative purposes, this need not be the case, and switch adapter 100 can include any number of accesses in any portion thereof (e.g., in one or more sides, the top, the bottom, or elsewhere) as needed or desired for an application or implementation, which can include comprising multiple accesses in any one side or other portion of support 108 or another component of switch adapter 100. In at least one embodiment, one or more accesses 128a, 128b, etc., can be at least substantially sealed, including about a component disposed therein or therethrough, such as to prevent or minimize ingress or egress of water, chemicals, dirt, or the like. Sealing of an access can include the use of gaskets, sealants, O-rings, seals, or other sealing structures, such as metal-to-metal seals, sealing engagement between the access and a component coupled thereto, or the like.

With continuing reference to the figures, and specific reference to FIG. 4, another of many embodiments of a switch adapter according to the disclosure is shown. In at least one embodiment, a switch adapter 400 can be adapted to house or otherwise support a plurality of switching components, such as a switch 302 and one or more electrical components 312, such as terminal blocks, electrical junctions, wire connectors, quick disconnects, or the like. Such components can be coupled to any portion(s) of switch adapter 400, such as base 402 or support 408. As shown in FIG. 4 for exemplary purposes, base 402 and support 408 can, but need not, be formed integrally with one another, in whole or in part. In at least one embodiment, second end 310 of switch 302 can be disposed within switch adapter 400, as can be one or more clamps 130 for coupling switch 302 to base 402 or support 408. Alternatively, or collectively, switch adapter 400 can include one or more clamps 130 coupled to switch 302 on the exterior of switch adapter 400, such as for coupling switch 302 thereto or holding switch 302 in one or more positions relative thereto.

Turning more specifically to FIG. 6, another aspect of a switch adapter according to the disclosure will be described. In at least one embodiment, a switch adapter 100 (200, 400, etc.) can have an adjustable center of gravity, which can enable mass compensation or redistribution in one or more directions, or along one or more dimensions, of switch adapter 100 (e.g., along its length or width). Mass compensation or redistribution can take place in any direction or along any dimension according to a particular application at hand. In some applications, such as, for example, nuclear applications, a switch adapter can be required to meet one or more seismic specifications or standards (e.g., IEEE 323, IEEE 344, or IEEE 382), and a switch adapter having an adjustable center of gravity and/or mass according to the disclosure can facilitate compliance with such requirements. A switch adapter 100 can include a mass compensator system 134 for adjusting or otherwise changing the center of gravity of the adapter (whether separately or in combination with one or more switches or other components coupled to the adapter), such as by moving the center of gravity from one location to another location. A switch adapter 100 having a mass compensator system 134 can, in at least one embodiment, be adapted to mimic, match, or approximate one or more seismic characteristics of a switch, such as a switch being replaced with switch adapter 100 and a switch coupled therewith.

In such embodiments, switch adapter 100 can include one or more weights 136 adapted to couple with base 102 or another portion of adapter 100, such as support 108. For example, weight 136 can include one or more openings 138, such as holes or slots, for receiving or otherwise coupling with couplers 140 (e.g., screws or other fasteners) for coupling weight 136 to another component. In at least one embodiment, openings 138 can have a mounting pattern that matches that of one or more sets of openings or other couplers in or on base 102, such as openings 104d described above. One or more weights 136 can be selectively coupled to base 102 and/or support 108 in one or more positions and/or at one or more locations, which can move the center of gravity of switch adapter 100, such as to achieve a desired center of gravity or weight distribution for a particular application or implementation at hand. Switch adapter 100 can include any number of weights 136, such as one, two, three, up to ten, or more than ten.

In at least one embodiment, mass compensator system 134 can allow a user to achieve a desired center of gravity for switch adapter 100 without having to change one or more other aspects of an overall system, such as the position or weight of one or more other components, the position of one or more switches 302 (if present) relative to a support 108 or mount 500, or other characteristics of a switching arrangement. In at least one embodiment, mass compensator system 134 can allow a user to achieve a center of gravity for switch adapter 100 that is the same as or sufficiently similar to a center of gravity, mass or weight arrangement of a switch being replaced by switch adapter 100 and/or a switch coupled thereto. Mass compensator system 134 can affect one or more characteristics of switch adapter 100 that may be evaluated in connection with seismic qualification procedures, such as the relationship between amplitude ratio and frequency ratio, which can be indicative of a device's ability to meet its performance requirements (e.g., stress or deflection parameters) during or following one or more seismic events. As will be understood by a person of ordinary skill in the art having the benefits of the present disclosure, the mass of a device, such as switch adapter 100, a switch coupled thereto, or a switch to be replaced with a switch adapter according to the disclosure, can affect the loads applied to or acting on the device during seismic acceleration. In at least one embodiment, mass compensator system 134 can be used to change or adjust the mass of switch adapter 100 for obtaining a desired structural response under postulated event loadings, such as from a first response to a second response or one or more other responses.

As shown herein and described above for illustrative purposes, switch assembly 300 comprises a magnetic proximity switch (aka proximity sensor) such as that shown and described in U.S. Pat. No. 8,766,751, the entire contents of which is hereby incorporated by reference. This need not be the case, however, and alternatively, or collectively, switch assembly 300 can include one or more other proximity switches or proximity switch configurations, such as one or more of the many different proximity switches available from General Equipment and Manufacturing Co., Inc., dba TopWorx, whether now known or later developed. As will be understood by a person of ordinary skill in the art having the benefits of the present disclosure, the switch adapters disclosed herein can be adapted to accommodate numerous different switches and switch configurations as needed or desired for a particular application or implementation at hand.

In at least one embodiment, a switch adapter can include a base having one or more openings, such as thru or other openings, one or more supports coupled to the base, and one or more retainers. A support can have one or more accesses, such as one or more openings, which can include a first access and a second access, such as between an interior and an exterior of the support, or between two or more other portions of the support. A retainer can be adapted to couple to at least one of the base, the support, and a combination thereof. In at least one embodiment, the support can be adapted to couple to one or more switches, such as a proximity switch, which can include a switch adapted to take the place of another switch. An access of the support can be adapted to receive or otherwise support at least a portion of a proximity switch there through or therein, in whole or in part. A second or other access of the support can be adapted to receive or otherwise support at least one of a portion of the proximity switch, an electrical or other component coupled to the proximity switch there through or therein. One or more retainers or other couplers can be adapted to retain the proximity switch (if present) in at least one position relative to the support, base, or another portion of the switch adapter.

In at least one embodiment, a switch adapter can include a base having plurality of openings therein or there through, which can include two or more sets or groups of openings, such as a first set of openings adapted to couple the base to the support and a second set of openings adapted to couple the base to a switch mount, separately or in combination, in whole or in part. Two or more sets of openings of a switch adapter or portion thereof can be adapted to couple with one or more couplers, such as fasteners, and can be adapted to receive two or more couplers from one or more directions, which can include two or more different directions and, In at least one embodiment, opposite directions. A switch adapter can be adapted to hold or otherwise support one or more proximity switches in one or more positions, and can include one or more switches coupled to the adapter, such as to one or more components or portions thereof, separately or in combination, in whole or in part.

In at least one embodiment, a switch adapter can include one or more retainers adapted to couple to one or more portions of the adapter, such as a retainer(s) coupled to at least one of the base and the support, e.g., with one or more couplers. The switch adapter and a retainer can have one or more mounting patterns, such as a first or other mounting pattern. In at least one embodiment, a plurality of openings of the base can include openings having a second mounting pattern, such as a mounting pattern for coupling with a switch mount, bracket, or other structure. In at least one embodiment, two or more mounting patterns, such as a first mounting pattern and a second mounting pattern, or other mounting patterns, can be different in one or more manners, such as by having a different configuration of couplers.

In at least one embodiment, a switch adapter can be adapted to couple a switch to a switch mount, and can include a support adapted to couple to one or more switches, such as a magnetic proximity switch or other switch, and a base adapted to couple to one or more switch mounts, such as a mechanical limit switch mount or other switch mount. A switch adapter can be or include one or more at least partial enclosures, such as for at least partially enclosing a switch coupled with the adapter, one or more other components of the system, or one or more portions of any of them. In at least one embodiment, a switch adapter can include an enclosure adapted to enclose at least a portion of a proximity switch within an interior of the enclosure. A switch adapter can include one or more lids or other covers adapted to couple to the adapter, such as to the support or base. In at least one embodiment, a switch adapter can include a lid adapted to hold a retainer in one or more positions, such as in place relative to the support, which can include clamping or forcing at least a portion of the retainer between the lid and one or more other portions of the adapter. In at least one embodiment, a switch adapter can include a base adapted to couple to one or more switch mounts, such as a bracket or other structure for holding a switch. A switch adapter can be adapted to couple with a plurality of different switch mounts, such as two or more switch mounts having mounting configurations that differ from one another, such as by having different arrangements of couplers (e.g., male or female), openings, mating structures, or other mounting components.

In at least one embodiment, a switch adapter can include one or more electrical components, such as junctions, terminal blocks, electrical couplers, or other components for electrical communication, which can include one or more electrical components coupled at least partially within an interior of the adapter or a portion thereof, such as a support or base. In at least one embodiment, a switch adapter can be adapted to couple in a plurality of positions relative to one or more switch mounts, which can include having a base adapted to couple a support in a plurality of positions relative to a switch mount.

In at least one embodiment, a switch adapter can have an adjustable center of gravity, which can include having a mass compensator. In at least one embodiment, a mass compensator can include one or more weights or weighted structures adapted to couple to at least one portion of the adapter, such as to the base, the support, or a combination thereof. A switch adapter can include one or more weights adapted to be coupled to at least one of a base and a support in a plurality of positions, and a mass compensator can include one or more couplers for coupling one or more weights to one or more other components of the adapter. In at least one embodiment, a switch adapter can include a mass compensator adapted to change the center of gravity of the switch adapter from a first center of gravity to a second center of gravity, such as by moving the center of gravity of the adapter, which can include moving the center of gravity among one or more locations. In at least one embodiment, a switch adapter can include a mass compensator adapted to adjust the center of gravity of the switch adapter.

In at least one embodiment, a switch adapter system can include a proximity switch and a switch adapter. A switch adapter can include a base having a plurality of openings there through, a support coupled to the base, and one or more accesses from an interior to an exterior of the adapter. One or more retainers can be coupled to the adapter, such as to at least one of the base and the support. One or more proximity switches can be coupled to the support. At least a portion of a proximity switch can extend or otherwise be disposed at least partially within or through one or more accesses. At least one of a portion of a proximity switch and an electrical component or other switching component coupled to the proximity switch, directly or indirectly, can extend or otherwise be disposed at least partially in or through one or more accesses or other openings. A retainer can be adapted to retain a proximity switch in a plurality of positions relative to the support or another component of a switch adapter. A switch adapter can include one or more accesses in one or more sides, such as a first access disposed in one end of the adapter and one or more other accesses disposed in another end of the adapter, which can include opposite ends of the adapter or a component thereof. A switch adapter can include a plurality of openings or sets of openings, such as through the base, which can comprise a first set of openings and a second set of openings, or other groups of openings. Two or more openings or sets of openings can have different mounting patterns, which can be or include mounting patterns for different switches or switch mounts.

In at least one embodiment, a method of implementing a switch adapter according to the disclosure, such as for replacing a limit switch with a proximity switch, can include providing a switch adapter according to the disclosure. For example, a method can include providing a switch adapter comprising a base having a plurality of openings, a support coupled to the base, the support having a first access and a second access between an interior and an exterior of the support, and a retainer adapted to couple to at least one of the base and the support, wherein the retainer can be adapted to retain a proximity switch in at least one position relative to the support, and wherein the plurality of openings of the base can comprise at least two mounting patterns, such as mounting patterns matching a different limit switch mounting pattern or other pattern for a switch mount. A method can include removing a limit switch from a switch mount and coupling the switch adapter to the switch mount in place of the limit switch. A method can include coupling a proximity switch to a support with a retainer, which can include disposing a switch so that at least a portion of the switch extends at least partially through one or more accesses of a switch adapter. A method can include disposing a switch so that at least one of a portion of the switch and an electrical component or other component coupled to the switch extends at least partially through one or more accesses. A method can include adjusting the center of gravity of a switch adapter, which can include coupling at least one weight to the adapter or a component thereof, such as to the base, support, or another portion of a switch adapter, separately or in combination.

Other and further embodiments utilizing one or more aspects of the inventions described above can be devised without departing from the spirit of Applicants' invention. For example, a switch adapter according to the disclosure can include multiple triggering mechanisms, which can provide a user with a plurality of options for initiating switching. Further, the various methods and embodiments of the switch adapters according to the disclosure can be included in combination with each other, in whole or in part, to produce variations of the disclosed methods and embodiments. Discussion of singular elements can include plural elements and vice-versa.

The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the inventions have been described. Obvious modifications and alterations to the described embodiments are available to those of ordinary skill in the art having the benefits of the present disclosure. The disclosed and undisclosed embodiments are not intended to limit or restrict the scope or applicability of the inventions conceived of by the Applicants, but rather, in conformity with the patent laws, Applicants intend to fully protect all such modifications and improvements that come within the scope or range of equivalent of the following claims.

What is claimed is:

1. A switch adapter, comprising:
a base having a plurality of openings;
a support coupled to the base, the support including one or more sidewalls defining an interior and having a first access and a second access extending through the one or more sidewalls providing access to the interior of the support; and
a retainer coupled to at least one of the base and the support;
wherein the support is adapted to couple to a proximity switch;
wherein the first access of the support is adapted to receive at least a portion of the proximity switch there through;
wherein the second access of the support is adapted to receive at least one of a portion of the proximity switch and an electrical component coupled to the proximity switch there through; and
wherein the retainer is adapted to retain the proximity switch in at least one position relative to the support.

2. The switch adapter of claim 1, wherein the plurality of openings of the base comprise a first set of openings adapted to couple the base to the support and a second set of openings adapted to couple the base to a switch mount.

3. The switch adapter of claim 2, wherein the first set of openings and the second set of openings are adapted to receive fasteners from different directions.

4. The switch adapter of claim 1, further comprising a proximity switch coupled to the support.

5. The switch adapter of claim 1, wherein the retainer is coupled to at least one of the base and the support with a plurality of couplers having a first mounting pattern, wherein the plurality of openings of the base comprise a set of openings having a second mounting pattern for coupling with a switch mount, and wherein the first mounting pattern and the second mounting pattern are different.

6. The switch adapter of claim 1, wherein the support is adapted to couple to a proximity switch and the base is adapted to couple to a mechanical limit switch mount.

7. The switch adapter of claim 1, wherein the one or more sidewalls of the support comprises one or more upstanding sidewalls defining an enclosure adapted to enclose at least a portion of the proximity switch within the interior of the enclosure.

8. The switch adapter of claim 1, further comprising a lid coupled to the support, wherein the lid is adapted to hold the retainer in place relative to the support.

9. The switch adapter of claim 1, wherein the base is adapted to couple to a plurality of different switch mounts.

10. The switch adapter of claim 1, further comprising an electrical junction coupled at least partially within the interior of the support.

11. The switch adapter of claim 1, wherein the base is adapted to couple the support in a plurality of positions relative to a switch mount.

12. The switch adapter of claim 1, further comprising a mass compensator comprising at least one weight coupled to at least one of the base and the support.

13. The switch adapter of claim 12, wherein the weight is adapted to be coupled to at least one of the base and the support in a plurality of positions relative to the base.

14. The switch adapter of claim 12, wherein the mass compensator is adapted to change the center of gravity of the switch adapter from a first center of gravity to a second center of gravity.

15. The switch adapter of claim 12, wherein the mass compensator is adapted to adjust the center of gravity of the switch adapter.

16. A switch adapter system, comprising:
a proximity switch; and
a switch adapter configured to couple to a switch mount, the switch adapter comprising
a base having a plurality of openings there through, the plurality of openings comprising at least two mounting patterns, each mounting pattern matching a different switch mounting pattern;
a support coupled to the base, the support having a first access and a second access between an interior and an exterior of the support; and
a retainer coupled to at least one of the base and the support;
wherein the proximity switch is coupled to the support;
wherein at least a portion of the proximity switch extends at least partially through the first access;
wherein at least one of a portion of the proximity switch and an electrical component coupled to the proximity switch extends at least partially through the second access; and
wherein the retainer is adapted to retain the proximity switch in a plurality of positions relative to the support.

17. The switch adapter of claim 16, wherein the first access is disposed in a first end of the support and the second access is disposed in a second end of the support opposite the first end.

18. The switch adapter of claim 16, wherein the plurality of openings through the base comprises a first set of openings and a second set of openings, and wherein the first and second sets of openings have different mounting patterns.

19. A method of replacing a limit switch with a proximity switch, comprising:
providing a switch adapter comprising
a base having a plurality of openings;
a support coupled to the base, the support having a first access and a second access between an interior and an exterior of the support; and
a retainer adapted to couple to at least one of the base and the support;
wherein the retainer is adapted to retain a proximity switch in at least one position relative to the support; and
wherein the plurality of openings of the base comprise at least two mounting patterns, each mounting pattern matching a different limit switch mounting pattern;
removing the limit switch from its switch mount;
coupling the switch adapter to the switch mount; and
coupling the proximity switch to the support with the retainer so that at least a portion of the proximity switch extends at least partially through the first access and at least one of a portion of the proximity switch and an electrical component coupled to the proximity switch extends at least partially through the second access.

20. The method of claim 19, further comprising adjusting the center of gravity of the switch adapter by coupling at least one weight to the base.

* * * * *

UNITED STATES PATENT AND TRADEMARK OFFICE
CERTIFICATE OF CORRECTION

PATENT NO. : 10,298,229 B2
APPLICATION NO. : 15/399736
DATED : May 21, 2019
INVENTOR(S) : Robert L. LaFountain et al.

Page 1 of 1

It is certified that error appears in the above-identified patent and that said Letters Patent is hereby corrected as shown below:

On the Title Page

Item (72), Line 1, "Scottsburgh, IN" should be -- Scottsburg, IN --.

In the Specification

At Column 3, Line 6, "and, In" should be -- and, in --.

At Column 12, Line 5, "and, In" should be -- and, in --.

In the Claims

At Column 16, Line 15, "switch adapter" should be -- switch adapter system --.

At Column 16, Line 19, "switch adapter" should be -- switch adapter system --.

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*